United States Patent
B et al.

(10) Patent No.: US 12,020,855 B2
(45) Date of Patent: Jun. 25, 2024

(54) TEST AND MEASUREMENT INSTRUMENT FOR DETERMINING MAGNETIC CORE LOSSES

(71) Applicant: Tektronix, Inc., Beaverton, OR (US)

(72) Inventors: Shubha B, Bengaluru (IN); Niranjan R Hegde, Siddapur (IN); Yogesh M Pai, Bengaluru (IN); Gajendra Kumar Patro, Bengaluru (IN); Krishna N H Sri, Bengaluru (IN)

(73) Assignee: Tektronix, Inc., Beaverton, OR (US)

( * ) Notice: Subject to any disclaimer, the term of this patent is extended or adjusted under 35 U.S.C. 154(b) by 355 days.

(21) Appl. No.: 17/315,022

(22) Filed: May 7, 2021

(65) Prior Publication Data
US 2021/0358685 A1    Nov. 18, 2021

(30) Foreign Application Priority Data

May 16, 2020   (IN) .............................. 202021020713
Jul. 24, 2020   (IN) .............................. 202021031825

(51) Int. Cl.
*H01F 27/34*      (2006.01)
*G01R 33/14*      (2006.01)
*H01F 3/10*       (2006.01)
*H01F 27/24*      (2006.01)
*H01F 27/42*      (2006.01)

(52) U.S. Cl.
CPC ............ *H01F 27/346* (2013.01); *G01R 33/14* (2013.01); *H01F 3/10* (2013.01); *H01F 27/24* (2013.01); *H01F 27/42* (2013.01); *H01F 2003/106* (2013.01); *H01F 2027/348* (2013.01)

(58) Field of Classification Search
CPC .......... H01F 27/346; H01F 3/10; H01F 27/24; H01F 27/42; H01F 2003/106; H01F 2027/348; G01R 33/14; G01R 33/123
See application file for complete search history.

(56) References Cited

U.S. PATENT DOCUMENTS

| | | | |
|---|---|---|---|
| 5,576,681 A * | 11/1996 | Sander ................ | H01F 38/42 336/185 |
| 11,275,131 B1 * | 3/2022 | Vasudev ............ | G01R 33/14 |
| 2005/0184736 A1 * | 8/2005 | Ramesh ............ | G01R 33/14 324/522 |

(Continued)

*Primary Examiner* — Christopher P McAndrew
*Assistant Examiner* — Zannatul Ferdous
(74) *Attorney, Agent, or Firm* — Miller Nash LLP; Andrew J. Harrington

(57) ABSTRACT

A test and measurement instrument for determining magnetic core losses of a device under test during in circuit operation. The test and measurement instrument receives a primary current signal from a primary winding of a device under test and receives a primary voltage signal measured across a magnetic core of the device under test. Based on the primary electric current signal and the primary voltage signal, the test and measurement instrument determines a magnetic loss of the device under test. In some examples, the test and measurement instrument can use primary and secondary voltage and current inputs to determine the magnetic loss of the device under test. The magnetic loss of the device under test can be displayed on a display of the test and measurement instrument. The magnetic loss can include a total magnetic loss, a hysteresis loss, a copper loss, and/or other losses.

18 Claims, 7 Drawing Sheets

(56) References Cited

U.S. PATENT DOCUMENTS

2017/0299409 A1* 10/2017 Hess ................... G01D 5/2086
2018/0218828 A1*  8/2018 Ishigaki ................. H01F 3/10
2019/0178916 A1*  6/2019 Boettcher ............ G01R 15/183

* cited by examiner

300

| Power 1 |
|---|
| Magnetic Properties |
| Configure |

302 → Transformer Primary

| Voltage Source | Current Source | Label |
|---|---|---|
| Ch 1 ▽ | Ch 2 ▽ | Magnetic Property |

| | Units | Turns |
|---|---|---|
| Voltage \| Current | SI \| CGS | 1 |

| Cross Section Area | Magnetic Length | Cu Resistance |
|---|---|---|
| 1 m$^2$ | 1m | 1.3uΩ |

304 → Transformer Secondary

| Windings | |
|---|---|
| 3 ▽ | ☒ Enable Source Voltage |

| Voltage Source | Current Source | Turns | Cu Resistance |
|---|---|---|---|
| Ch 3 ▽ | Ch 4 ▽ | 1 | .18uΩ |
| Ch 5 ▽ | Ch 6 ▽ | 1 | .52uΩ |
| Ch 7 ▽ | Ch 8 ▽ | 1 | .75uΩ |

Fig. 4

TEST AND MEASUREMENT INSTRUMENT FOR DETERMINING MAGNETIC CORE LOSSES

PRIORITY

This disclosure claims benefit of Indian Provisional Application No. 202021020713, titled "DYNAMIC COMPUTATION AND SEPARATION OF MAGNETIC CORE LOSS INTO COPPER LOSS AND CORE LOSS," filed on May 16, 2020, and Indian Provisional Application No. 202021031825, titled "OSCILLOSCOPE BASED DYNAMIC COMPUTATION AND SEPARATION OF MAGNETIC CORE LOSS INTO COPPER AND CORE LOSS FOR A MULTI-CORE SYSTEM," filed on Jul. 24, 2020, each of which is incorporated herein by reference in its entirety.

TECHNICAL FIELD

The present disclosure relates to test and measurement systems, and more particularly to systems and techniques for measuring components of magnetic core loss. In particular, the present disclosure relates test and measurement instruments used to measure various characteristics of a device under test (DUT), such as inductors and multi-output transformer coils.

BACKGROUND

Inductors and multi-output transformer coils are often used in electrical vehicles and wireless charging for power conversion. When designing electrical circuits around these inductive elements, such as power converters, one of the major design considerations is total magnetic loss, which can include a number of different types of losses, such as hysteresis loss, eddy current loss, copper loss, etc.

Conventionally, to compute specific losses, such as hysteresis loss, also referred to herein as core loss, an empirical formula is used based on information found from a data sheet for the inductor and/or transformer that only gives an approximate value of how much core loss is present in a particular transformer or inductor. However, in electric vehicles and wireless charging devices, the core loss, or hysteresis loss, value is critical for design efficiency. Despite this criticality, core loss presently is computed from the data sheet information of the core which only provide an approximate, and often inaccurate, value for the core loss. That is, core loss computed conventionally does not provide any accurate real-time or in-circuit core loss measurement.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which:

FIG. 4 is another example graphical user interface that can be displayed on the test and measurement instrument of FIG. 2.

DESCRIPTION

Figure 1:
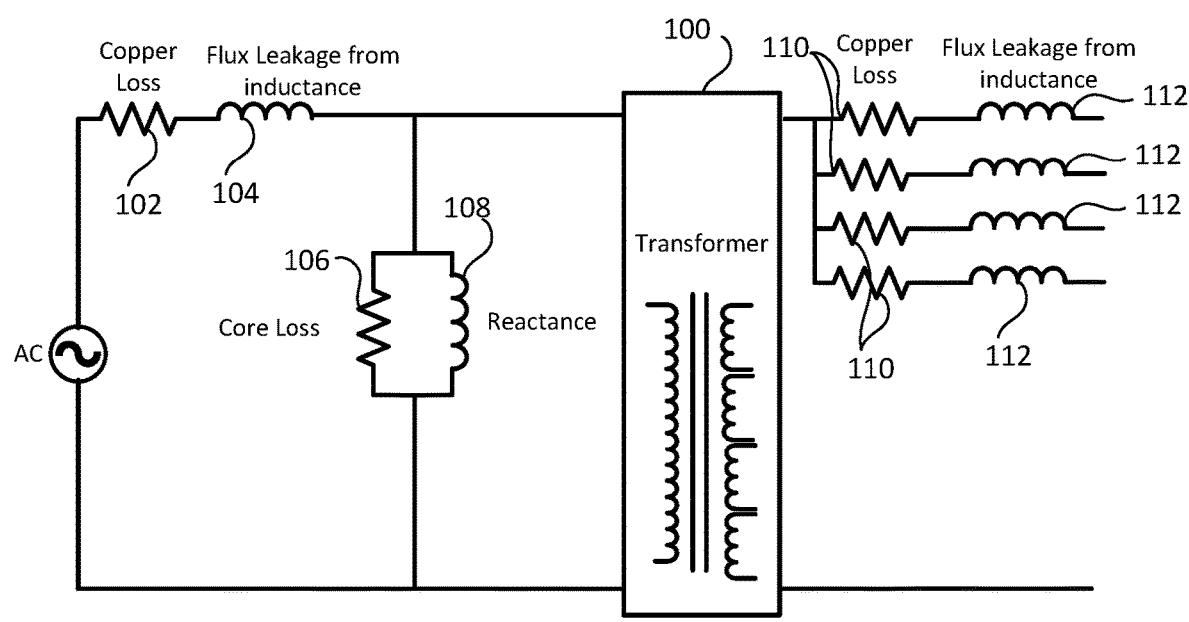
FIG. 1 is an equivalent circuit diagram of an industrial transformer.

Generally, test and measurement instruments are used to measure various characteristics of a device under test (DUT), such as inductors and multi-output transformer coils. However, there are no present test and measurement instruments that can measure the different types of magnetic losses, such as hysteresis loss and copper loss, during in-circuit operation of inductors and multi-output transformer coils.

The hysteresis loss value for a particular core is of high importance for design efficiency in power converters, as even small improvements in efficiency can result in substantial savings for an end user. The hysteresis loss value depends on the magnetic properties of the selected core material for the inductor or transformer, and includes hysteresis loss and eddy current loss, which are also known as core/iron loss. Copper loss is due to the resistance of the windings in the inductor and depends on the electrical load that is connected to the secondary side of the transformer.

When an inductor or transformer loss is measured using a test and measurement instrument, the result is the total magnetic loss, which includes both the copper loss in the primary and secondary windings and the magnetic hysteresis loss. If specific types of losses are desired to be determined by a designer, then conventional methods involve computing those losses by empirical formulas using data from a datasheet that gives only an approximate value of the core loss.

However, the published loss values on the data sheets for various core materials are derived from known sinusoidal stimuli. These sinusoidal-derived values are not very helpful or useful for designers interested in knowing in-circuit operation of the magnetic cores, as non-sinusoidal stimulus may be present during in-circuit operation. Further, even if the excitation is sinusoidal, a voltage captured across the coil can behave as non-sinusoidal due the inductive reactance's effect, and will not match the data sheet values. So, even if core loss is interpreted from a provided data sheet graph, it will likely not be accurate of real-world losses.

Core loss can be calculated as per Steinmetz empirical formula or manufacturer's equation using information from the manufacturer's data sheet. The core loss equation can be computed using an empirical formula by equation (1):

$$Kh*f*B^n \text{peak} + Ke*f2 + B^2\text{peak} \quad (1)$$

Where, Kh is hysteresis constant and Ke is Eddy current constant and 'n' is a Steimetz exponent, which may vary from 1.5 to 2.6 and for iron is 1.6. Kh and Ke are taken from the electrical data sheet graph at magnetic flux peak value (Bpeak), using the core manufacturer's data sheet. The material constants Kh and Ke taken from the data sheet are valid for a fixed frequency, flux density, and applicable for sinusoidal excitation, which may not be accurate for an in-circuit operation. As such, the Seinmetz's formula or manufacturer's formula may not provide accurate core loss values for in-circuit operation of an inductor or transformer.

FIG. 1 is an equivalent circuit of an industrial transformer 100 that indicates the types of losses that occur during operation. The resistor 102 represents the copper loss in the primary winding, and the inductor 104 represents flux leakage from inductance. The core loss is represented by the resistor 106, while the reactance of the transformer 100 is represented by the inductor 108.

When power is supplied to the primary winding of a transformer, some portion of the power is used to compensate for core losses in the transformer. This happens in case of both step-up and step-down transformers. It is important for designers to be able to determine and separate different loss components.

As can be seen in FIG. 1, the transformer 100 has four secondary windings, so resistors 110 represent the copper loss of each of the secondary windings, and the inductors 112 represent the flux leakage from inductance of the secondary windings. As discussed above, it can be beneficial to a designer to be able to measure these losses during in circuit operation, rather than determining the losses from data sheets or empirical formula calculations, to improve efficiency in the designs of their circuits, such as power converters.

Figure 2:
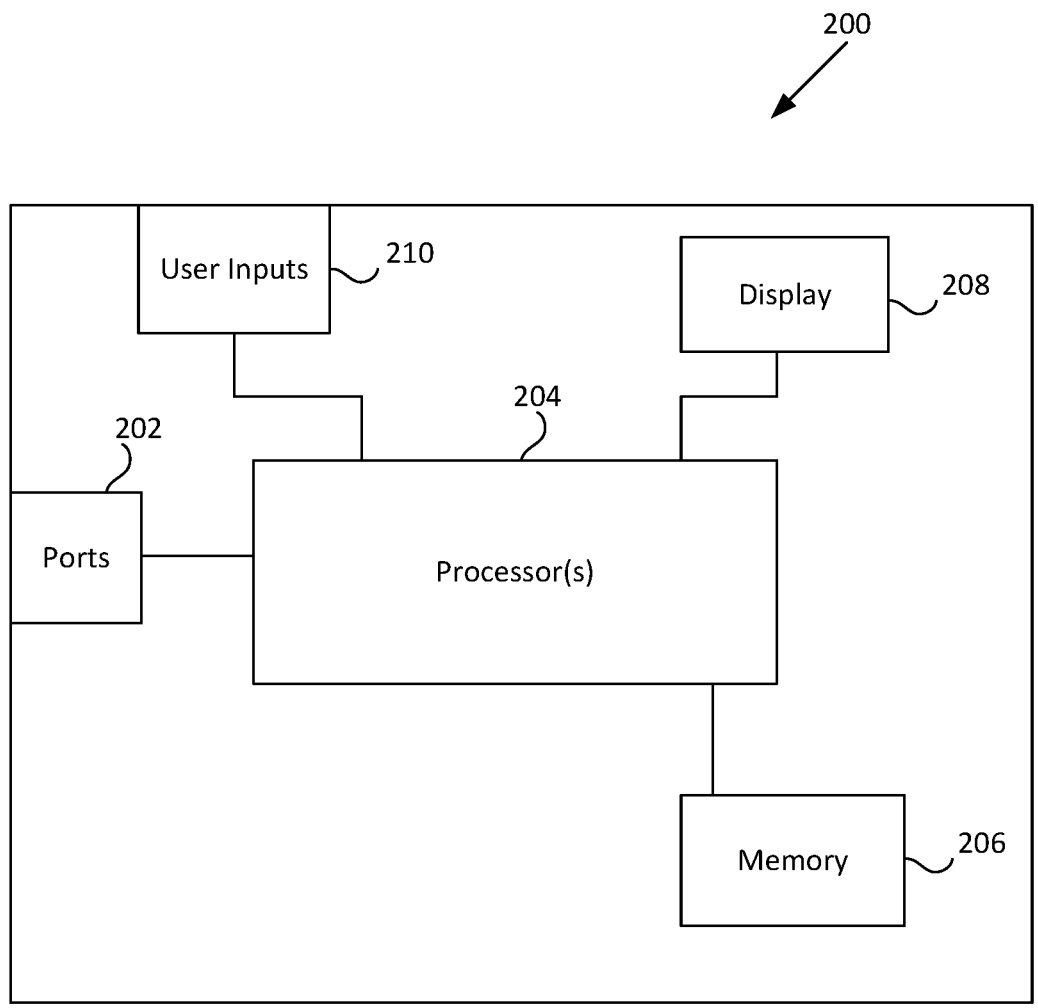
FIG. 2 is a block diagram of an example test and measurement instrument according to some examples of the disclosure.

FIG. 2 is a schematic block diagram of an example test and measurement instrument 200, such as an oscilloscope, for implementing examples of the disclosure disclosed herein. The instrument 200 includes a number of ports 202, which may be any electrical signaling medium. Ports 202 may include receivers, transmitters, and/or transceivers, for example. One or more of the ports 202 may be connected to a device under test through a voltage or current probe, for example, to receive a signal from the device under test, such as an inductor or transformer. The electrical signal from the device under test may include, for example, a current and/or voltage measured across the magnetic core of a magnetic component of the device under test. For example, one port 202 input could be connected to a voltage probe to receive a voltage across the device under test, while another input port 202 is connected to a current probe to receive a current at the device under test. Further, additional ports 202 may be included to receive additional currents, and, in some examples, voltages at secondary windings of the device under test, as will be discussed more below.

The ports 202 are coupled with a processor 204, which may either include a measurement unit or may connect to a measurement unit. Such a measurement unit can include any component capable of measuring aspects (e.g., voltage, amperage, amplitude, etc.) of a signal received via ports 202. The processor 204 can include a magnetic loss unit, which is discussed in more detail below, and can determine a magnetic loss including at least a total loss, a hysteresis loss, and copper loss, as well as other losses. The connection depicted from ports 202 to processor 204 can include conditioning circuits, an analog to digital converter, and/or other circuitry to convert a received signal to a waveform for further analysis. The resulting waveform or parameters thereof can then be stored in a memory 206.

The processor 204, may be implemented as any processing circuitry, such as an application specific integrated circuit (ASIC), a digital signal processor (DSP), a field programmable gate array (FPGA), etc. The processor 204 is configured to execute instructions from memory 206 and may perform any methods and/or associated steps indicated by such instructions. Memory 206 may be implemented as processor cache, random access memory (RAM), read only memory (ROM), solid state memory, hard disk drive(s), and/or any other memory type. Memory 206 acts as a medium for storing data, computer program products, and other instructions, and providing such data/products/instruction to the processor 204 for computation as desired. Memory 206 also stores, for example, information or commands received from user inputs 210 for use by the processor 204. Memory 206 may be composed of multiple memories of different types working together or independently within the test and measurement instrument. For example, one memory may store the instructions for the processor 204 while another memory may store received data from a device under test.

User inputs 210 are coupled to the processor 204. User inputs 210 may include a keyboard, mouse, trackball, touchscreen, and/or any other controls employable by a user to interact with a graphic user interface (GUI) on a display 208. The display 208 may be a digital screen, a cathode ray tube based display, or any other monitor to display test results to a user as discussed herein. While the components of test instrument 200 are depicted as being integrated within test instrument 200, it will be appreciated by a person of ordinary skill in the art that any of these components can be external to test instrument 200 and can be coupled to test instrument 200 in any conventional manner (e.g., wired and/or wireless communication media and/or mechanisms).

Inductors can have a single winding around a core, whereas transformers have a primary winding and one or more secondary windings. Examples of the disclosure allow a user to input via user inputs 210 various information regarding the device under test.

Figure 3:
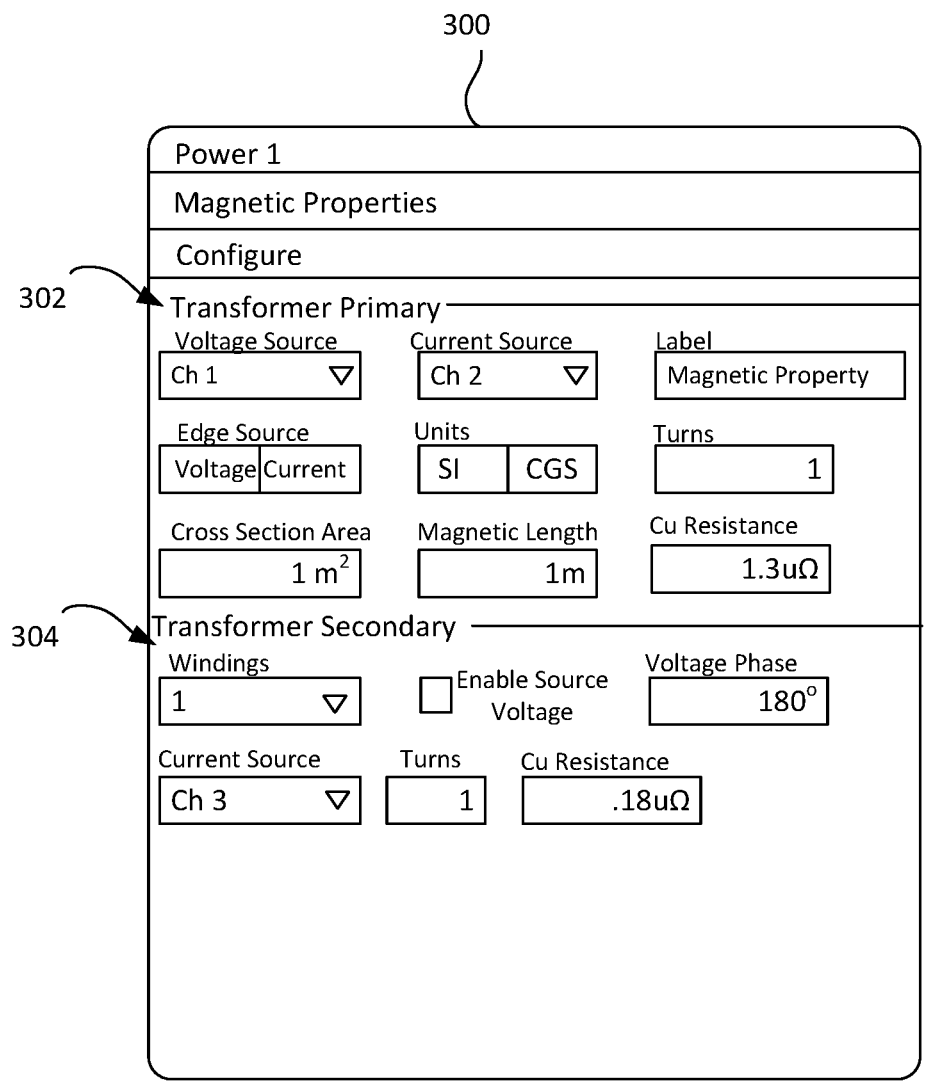
FIG. 3 is an example graphical user interface that can be displayed on the test and measurement instrument of FIG. 2.

For example, FIG. 3 illustrates a graphical user interface (GUI) 300 that may be displayed to the user on the display 208 of the test and measurement instrument 200. The GUI 300 can include a first section 302 for a user to indicate properties of the primary windings of a device under test, such as a transformer or inductor, and a second section 304 for properties of the secondary windings of the transformer. A user can select that there are no secondary windings, for example, if the device under test is an inductor.

In the first section 302 of GUI 300, drop down menus or fields for a user to input information are provided, as seen in FIG. 3. For example, a voltage source channel may be selected and a current source channel may be selected for the primary winding. There may also be input fields for the cross-section area of the core of the device under test, as well as the magnetic length of the device under test, and the copper resistance of the primary winding of the device under test, for a user to input information from the data sheet of the device under test.

In the second section 304, additional fields and/or drop down menus are provided for a user to input information through the user inputs 210. If no secondary windings are needed, such as for an inductor, then a user can just select zero for the number of windings. However, as seen in FIG. 3, in this example, one winding is selected. In some examples, a voltage source input can be enabled for the secondary windings by a selection of a box. However, it can be difficult sometimes for a user to probe a secondary voltage on their device under test and in such situations, the user may enter the phase relationship for the secondary windings in an input field. The channel for the current source of the secondary winding is received, as well as the number of turns and the resistance of the copper winding for the secondary winding.

FIG. 4, on the other hand, illustrate another example of a GUI 400 with different selections from GUI 300. GUI 400 still includes a first section 302 for entering information regarding the magnetic core of the device under test and the primary winding, as well as a second section for entering information regarding the secondary windings.

In the example GUI 400 of FIG. 4, three windings have been selected in the second section 304. Further, the enable source voltage is selected, so input fields appear to select the channels to receive the secondary voltage sources. A voltage source channel selection, current source channel selection, number of turns, and copper resistance fields are provided for each of the three selected windings.

Each of the channels discussed above are associated with a respective port 202 in test and measurement instrument 200. The number of windings are limited to the number of ports 202 available in the test and measurement instrument 200. However, as will be understood by one skilled in the art, multiple test and measurement instruments 200 may be synchronized to provide additional ports 202 as needed to gather the input for a number of different voltage probes and current probes across the device under test. The measurements from any auxiliary test and measurement instruments may be sent to a single processing unit, composed of one or more processors 204. The processors 204 on one of the test and measurement instruments may be used, or a processor remote from the test and measurement instruments may be used to perform the examples of the disclosure.

Once the user input information has been received, the voltage and current across the primary windings are collected via the channels connected to the voltage and current probes, and the current and sometimes voltage, if the secondary voltage source is enabled, are collected via the current and voltage probes connected to those channels.

As discussed above with respect to FIGS. 3 and 4, there are two ways to determine the secondary voltage sources. First, as illustrated in FIG. 4, the user can enable the secondary voltage sources function and the secondary voltages of the secondary windings can be received at dedicated channels of the test and measurement instrument 202.

Second, as illustrated in FIG. 3, if a user is unable to probe the secondary voltages of the secondary windings, then a user can configure a secondary voltage phase relationship with the primary voltage. The secondary voltage to generate the BH curves is interpolated based on the primary voltage and the voltage phase entered by the user and the turns ratio of the primary and secondary windings.

To generate the secondary voltages, first, a number of samples are determined that are to be adjusted for the configured voltage phase value, by equation 2:

$$\text{\#ofsamplesAdjust} = (\text{Voltage Phase} * \text{\#ofSamplesPerCycle}) / \text{CyclePhase} \tag{2}$$

Where the #ofsamplesPerCycle is the number of samples present in the Bpeak cycle. That is the #ofSamplesPerCycle is equal to the index difference between two consecutive zero crossings. The zero crossing are found by an edge computation of the voltage or current sources.

A CyclePhase is always 360 degrees for one complete cycle, so equation 2 becomes:

$$\text{\#ofsamplesAdjust} = (\text{Voltage Phase} * \text{\#ofSamplesPerCycle}) / 360 \text{deg} \tag{3}$$

The secondary voltage is then:

Secondary voltage($n$)=(# of Secondary turns/# of Primary turns)*Primary voltage($n$+#ofsamplesAdjust), where $n$ is a first sample index. (4A)

The secondary voltage per winding can be determined by using equation (4B):

Secondary voltage per winding($n$)=(# of Secondary turns per winding/# of Primary turns)*Primary voltage($n$+#ofSamplesAdjust) (4B)

The secondary winding voltage is used for determining the secondary power consumption of the secondary windings by multiplying the secondary voltage per winding by the secondary current of the winding. The secondary power is used to determine the total magnetic loss, as discussed in more detail below.

Figure 5:
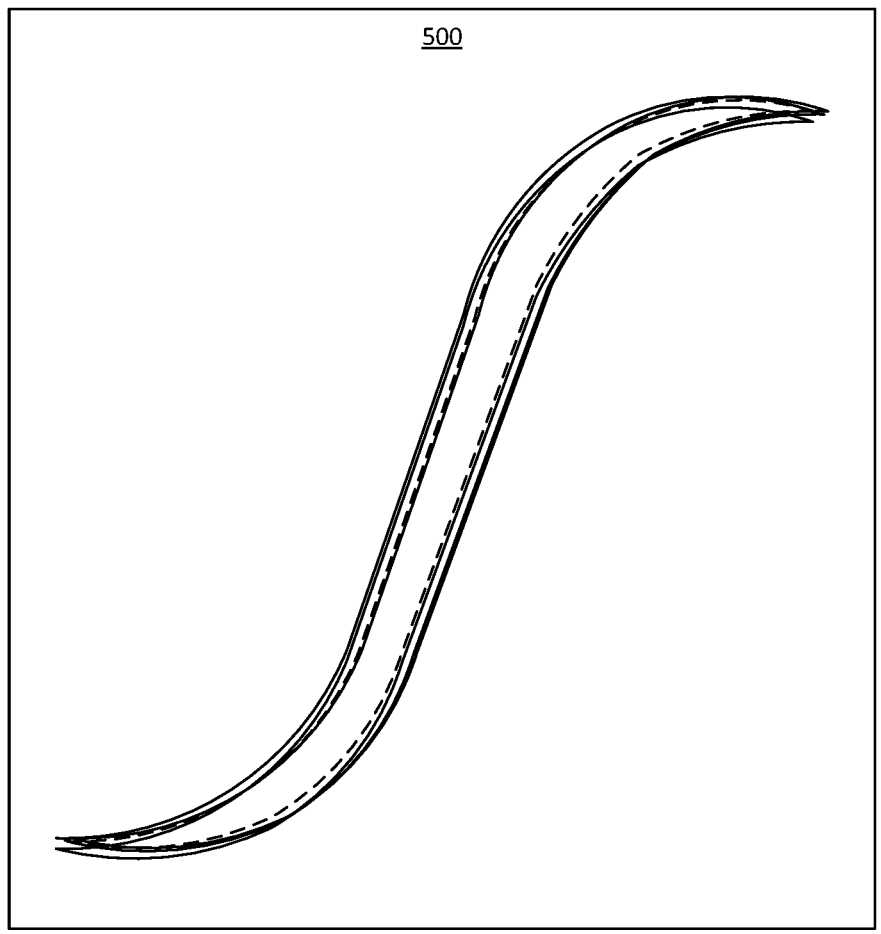
FIG. 5 is an illustration of an example magnetic flux (B) vs magnetic intensity (H) curve.

After the acquisition of the primary and secondary voltages and currents across a device under test, such as a coiled inductor or a transformer, the processor 204 can generate a BH curve based on the acquisition of the primary and secondary voltages and currents of the device under testing during an in-circuit operation, using known operations. A BH curve is generally used to describe the non-linear behavior of magnetization that a core obtains in response to an applied magnetic field. The magnetic flux B and the magnetic field intensity H are determined based on the acquired primary and secondary voltages and currents and plotted to generate a number of BH curves 500 that generally overlap as shown in FIG. 5, using known methods in the art.

The curve of the BH curves with the maximum magnetic flux density induced in the core is referred to as the Bpeak curve, which becomes the reference point for using a time-domain voltage and current curve. The Bpeak curve can be selected automatically by the processor 204 based on the overlapping BH curves in FIG. 5. In FIG. 5, the Bpeak curve is shown as a dashed line. The core loss or hysteresis loss can be generated based on the area of the Bpeak curve.

Once the BH curves have been determined based on either the computed or resultant secondary voltage or the measured secondary voltages, the processor 204 can determine the area of the primary Bpeak curve of the primary winding and each of any of the secondary windings, if present, using equation 5:

Bpeak Area=$\int dB_{primary} - (\int H \, dB_{secondary(1)} + \int H \, dB_{secondary(2)} + \ldots + \int H \, dB_{secondary(k)})$, where $k$ is the number of secondary windings. (5)

That is, the Bpeak area is determined by subtracting the area of the Bpeak curves for the secondary windings from the area of the Bpeak curve of the primary winding. Generally, the area of the Bpeak curves are closed loop areas. However, in some situations, a Bpeak curve may not be converging, which can results in errors when determining the area. In such situations, the processor 204 can integrate between the first and last points to create a complete loop. This generally will not affect the results, as it is usually only a few points needed on the Bpeak curve to complete the loop.

The energy consumed per cycle, or the hysteresis loss, is equal to the product of volume of the inductor or transformer windings and the Bpeak area. The volume can be computed by multiplying the cross-section area entered by a user on the GUI 300 or 400 by the coil length entered by the user.

In the case of a transformer, the winding can be considered a magnetic core of the transformer. For ferromagnetic materials, magnetic length is a circumference in meters and the cross-section area is in meters squared.

The final hysteresis loss is the product of the area of the BH curve from equation (5) above and the volume, which is the cross section area times the length of the magnetic core that are determined based on the user inputs and available on the datasheet, as shown in equation (6):

Hysteresis loss=equation (5)*Volume (6)

A copper loss can also be computed in some examples of the disclosure, using the user input of the copper wire resistance, as shown in FIGS. 3 and 4.

The copper resistance of the windings can be either alternative current (AC) or direct current (DC) in nature. Generally, a copper DC resistance can be entered directly from the data sheet for the winding.

However, an AC resistance can be determined based on a resistivity constant ρ, a wire bare cross-sectional area, and a length of the wire, using equations (7) and (8):

$$R_{dc} = \rho * l_b / A_w \quad (7)$$

$$R_{ac} = (h/\text{delta}) * R_{dc} \quad (8)$$

Aw is wire bare cross-sectional area and $I_b$ is the length of the wire. A resistivity constant p is 1.72410×10$^{-6}$ Ohm-cm for soft annealed copper at room temperature. Delta is the penetration depth or skin depth of the copper winding and h is the thickness of the core layers.

A DC resistance value can be used to determined DC copper loss per winding during in-circuit operation, which provides a low frequency copper loss, using equation (9):

$$Cu_{Loss} = I^2_{rms} * Cu_{Resistance} \quad (9)$$

Where $I_{rms}$ is the rms value of the current through the winding(s).

The effective copper loss, $Cu_{LossEff}$, between the Primary and Secondary loss is:

$$Cu_{LossEff} = Cu_{LossPrimary} - (Cu_{LossSecondary(1)} + Cu_{LossSecondary(2)} + \ldots + Cu_{LossSecondary(k)}) \quad (10)$$

This $Cu_{LossEff}$ gives an approximate copper loss since it may not have AC component if only DC resistance is provided.

A total loss of the core can also be determined, such as by equation 11, using known operations:

$$\text{Total Magnetic Loss} = \text{Power}_{Primary} - (\text{Power}_{Secondary(1)} + \text{Power}_{Secondary(2)} + \ldots + \text{Power}_{Secondary(k)}),$$
where k is the number of secondary windings. (11)

The hysteresis loss and the effective copper loss can be subtracted from the total loss, such as shown in equation (12), to determine other losses present, such as AC copper loss and Eddy current losses.

$$\text{Other losses} = \text{Total Magnetic Loss} - Cu_{LossEff} - \text{Hysteresis Loss} \quad (12)$$

Each of these losses, total magnetic loss, hysteresis loss, copper loss, and other losses of the device under test can be displayed on the display 208 of the test and measurement instrument 200.

Figure 6:
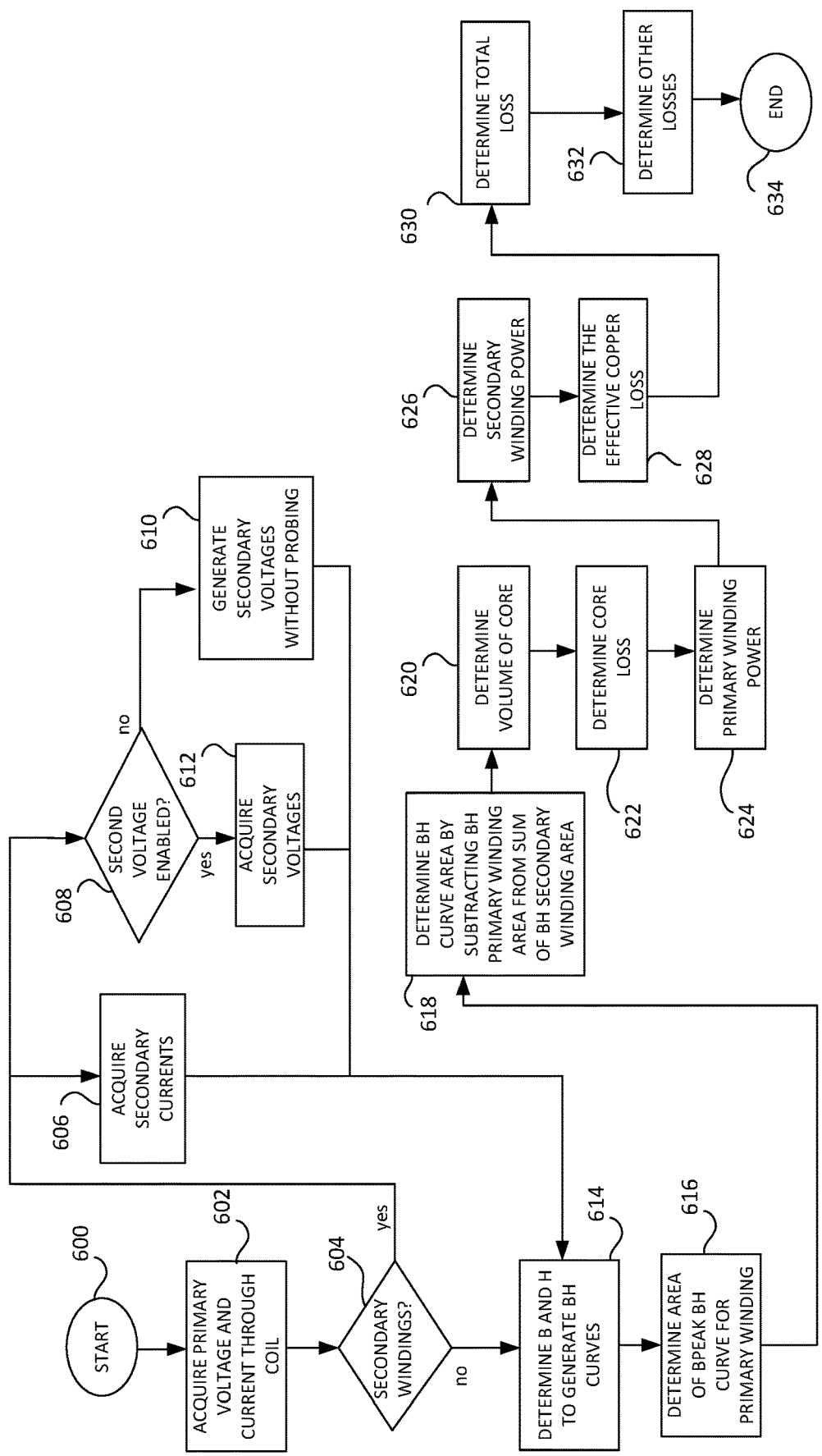
FIG. 6 is a flow chart of a process of the test and measurement instrument of FIG. 2 according to some examples of the disclosure.

FIG. 6 is a flow chart illustrating an operation of a test and measurement instrument 200 according to some examples of the disclosure. The process begins at operation 600 by receiving a user input to begin testing of a device under test. In operation 602, the primary voltage and current through the device under test are received at ports 202 and may be stored in memory 206.

If operation 604 indicates there are secondary windings present, then the secondary currents are acquired during operation 606 through current probes connected to one or more ports 202. In operation 608, it is determined if the secondary voltage is enabled. If the secondary voltage is not enabled in operation 608, then the secondary winding voltages are determined by the processor 204 based on the primary voltage, turns ratio, and phase, as discussed above, in operation 610. If the secondary voltage is enabled in operation 608, then the secondary winding voltages are acquired in operation 612. The secondary currents and secondary voltages can be obtained simultaneously.

One or more magnetic flux B and the magnetic field intensity H are determined by processor 204 and a BH curve can be generated in operation 614. In some examples, the BH curve may be displayed on the display 208 to a user. In other examples, the BH curve is determined by the processor 204 so that the area of the Bpeak curve of the BH curves of the primary winding can be determined in operation 616. If the Bpeak curve has not converged, the first and last points can be integrated to complete the loop, as discussed above.

If secondary windings were determined in operation 604 from the user information input on the GUI 300 or GUI 400, then a resultant BH curve area is determined as discussed above in equation (5) in operation 618. That is, the resultant BH curve, or Bpeak area, is determined by subtracting the sum of the area of the Bpeak curves of the secondary windings from the area of the Bpeak curve of the primary winding.

In operation 620, the volume of the core can be determined by the processor 204 by multiplying the cross-section area of the core entered by a user and the length of the core entered by the user. The hysteresis loss is determined in operation 622 using equation (6) above by multiplying the resultant BH area by the volume. In operation 624, the primary winding power can be determined by the processor 204 based on the voltage and current acquired.

If secondary windings are present, then using the secondary winding voltages from either operation 610 or operation 612, the secondary power of each winding can be determined by the processor 204 in operation 626. In operation 628, the effective copper loss is determined by the processor 204 based on the inputs from the user regarding the copper resistance and the acquired currents.

In operation 630, the total loss can be determined by the processor 204 based on the primary winding power determined in operation 618 and the secondary winding powers determined in operation 626. Based on each of the outputs of operations 630, operation 616 and operation 628, the other losses can be determined by the processor 204 in operation 632. That is, the other losses can be determined by taking the total loss determined in operation 630 and subtracting the hysteresis loss in operation 616 and the effective copper loss in operation 628. The process then ends at operation 634.

Although the process illustrated in the flow chart of FIG. 6 is shown in a generally linear fashion for ease of discussion, as will be understood by one skilled in the art, examples of the disclosure are not limited to this linear flow chart and the various operations may be performed in a variety of different orders or concurrently, in some instances. For example, the voltages and currents acquired in various operations may be acquired concurrently across the device under test. Further, the various losses may be determined in any order or concurrently by the processor 204.

Figure 7:
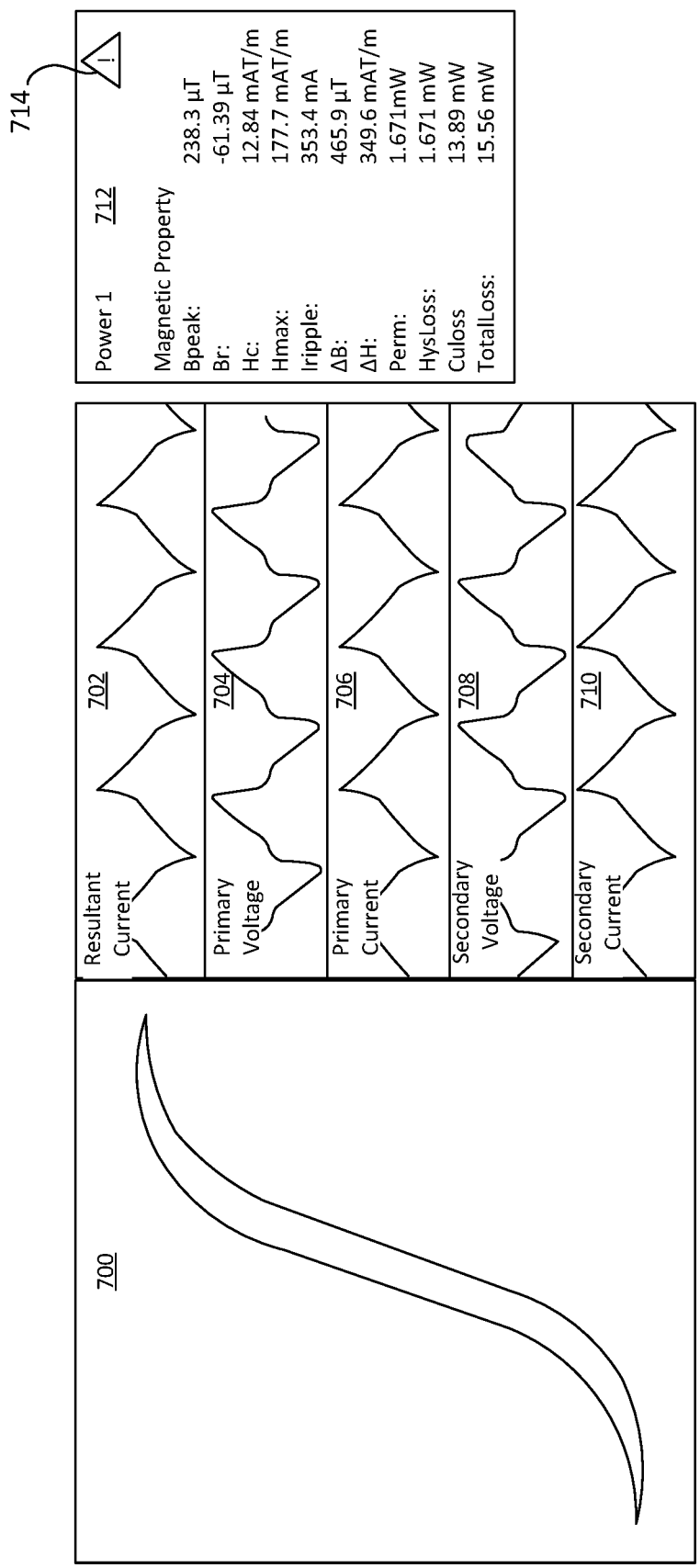
FIG. 7 is an example graphical user interface of the test and measurement instrument of FIG. 2.

FIG. 7 illustrates an example output to a display 208 once the operation in FIG. 6 is completed. The processor 204 may send instructions for the display 208 to display multiple windows. For example, a first window 700 may include one or more BH curves determined based on the acquired voltages and currents across the device under test during operation of the circuit. Window 702 may display the resultant current from the device under test, while window 704 displays the primary voltage across the device under test. The resultant current is determined by taking the mean of all the secondary winding currents.

Window 706 may display the primary current 706 across the device under test and window 708 may display the secondary voltage 708 across the device under test, if enabled. If the secondary voltage 708 is not enabled, as discussed above, either no secondary voltage is displayed, or the interpolated secondary voltage by the processor 204 is displayed. In window 710, the secondary current across the device under test can be displayed.

In the example of FIG. 7, only a primary winding and single secondary winding are present in the device under test. However, if additional secondary windings are present as entered by the user, then multiple secondary currents and voltages may be shown on the display 208. The display also may include a box or window 712 to display the magnetic properties determined from the device under test. For example, as seen in window 712, the hysteresis loss (Hys-Loss), copper loss (Culoss), and total loss (TotalLoss) are shown in the window 712. In some examples, the window 712 may also include a category of other losses that are displayed as well.

In some examples, the processor 204 can determine if the core loss and/or copper loss violate a desired value and display an alert 714 on the display 208. In FIG. 7, the alert is displayed as an icon which a user may be able to select. However, in other examples, the alert may be a text box that displays over all the windows on the display 208 or may be an audible alert. In some examples, the processor 204 will automatically display an alert if the hysteresis loss or the total loss are negative, indicating that the primary winding values are less than the secondary winding values.

Examples of the disclosure discussed above can allow a circuit designer to test their devices under test during in-circuit operation, to provide a more accurate real-time magnetic loss determination, regardless of the data sheet values of the magnetic core. This can allow a designer to then modify their circuits to improve efficiency in their circuit designs.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 a test and measurement instrument, comprising a first port configured to receive a primary current signal from a primary winding of a device under test; a second port configured to receive a primary voltage signal measured across a magnetic core of the device under test; one or more processors configured to determine a magnetic loss of the device under test based on the primary current signal and the primary voltage signal; and a display configured to display the magnetic loss of the device under test.

Example 2 is the test and measurement instrument of example 1, wherein the magnetic loss includes at least one of a total magnetic loss, a hysteresis loss, and other losses based on the total magnetic loss and the hysteresis loss.

Example 3 is the test and measurement instrument example 2, wherein the other losses include an eddy current loss and/or an alternating current copper loss Example 4 is the test and measurement instrument of any one of examples 1-3, further comprising a third port configured to receive a secondary current signal from the device under test acquired from a secondary winding of the device under test, wherein the one or more processors are further configured to determine the magnetic loss based on the primary current signal, the primary voltage signal, and the secondary current signal.

Example 5 is the test and measurement instrument of example 4, wherein a secondary voltage of the secondary winding of the device under test is determined based on a turns ratio between a primary winding and a secondary winding of the device under test and a phase relationship between the primary winding and the secondary winding.

Example 6 is the test and measurement instrument of either one of examples 4 and 5, wherein the magnetic loss is a hysteresis loss, and the hysteresis loss is determined by determining a magnetic flux versus magnetic intensity primary curve for the device under test based on the primary voltage signal and the primary current signal, determining a magnetic flux versus magnetic intensity secondary curve for the device under test based on the secondary current signal, and determining an area of the primary curve and the secondary curve.

Example 7 is the test and measurement instrument of any one of examples 1-6, wherein the magnetic loss is a hysteresis loss, and the hysteresis loss is determined by generating a magnetic flux versus magnetic intensity curve for the device under test and determining the hysteresis loss based on an area of the curve.

Example 8 is the test and measurement instrument of any one of examples 1-7, wherein the magnetic loss is a copper loss and the one or more processors are further configured to determine the copper loss based on the primary current signal and a copper resistance.

Example 9 is the test and measurement instrument of any one of examples 1-8, wherein the one or more processors are further configured to determine whether the magnetic loss violates a condition and to indicate an alert when the condition is violated.

Example 10 is the test and measurement instrument of any one of examples 1-9, further comprising a user input configured to receive one or more properties of the device under test.

Example 11 is a method for determining magnetic core losses of a device under test, comprising measuring a primary current signal of a primary winding of a device under test; measuring a primary voltage signal across a magnetic core of the device under test; determining a magnetic loss of the device under test based on the primary current signal and the primary voltage signal; and displaying the magnetic loss of the device under test.

Examples 12 is the method of example 11, wherein the magnetic loss includes at least one of a total magnetic loss, a hysteresis loss, and other losses based on the total magnetic loss and the hysteresis loss.

Example 13 is the method of example 12, wherein the other losses include an eddy current loss and/or an alternating current copper loss.

Example 14 is the method of any one of examples 11-13, further comprising measuring a secondary current signal of a secondary winding of the device under test, and wherein determining the total magnetic loss and the hysteresis loss includes determining the magnetic loss based on the secondary current signal.

Example 15 is the method of example 14, further comprising determining a secondary voltage of the secondary winding of the device under based on a turns ratio between a primary winding and a secondary winding of the device under test and a phase relationship between the primary winding and the secondary winding received.

Example 16 is the method of either one of examples 14 or 15, wherein the magnetic loss is a hysteresis loss, and the hysteresis loss is determined by determining a magnetic flux versus magnetic intensity primary curve for the device under based on the primary voltage signal and the primary current signal, determining a magnetic flux versus magnetic intensity secondary curve for the device under test based on the secondary current signal, and determining an area of the primary curve and the secondary curve.

Example 17 is the method of any one of examples 11-16, wherein the magnetic loss is a hysteresis loss, and the hysteresis loss is determined by determining a magnetic flux versus magnetic intensity curve for the device under test and determining the hysteresis loss based on an area of the curve.

Example 18 is the method of any one of examples 11-17, wherein the magnetic loss is a copper loss and the method further comprises determining the copper loss for based on the primary current signal and a copper resistance.

Example 19 is the method of any one of examples 11-18, further comprising determining whether the magnetic loss violates a condition and to instruct the display to display an alert when the condition is violated.

Example 20 is the method of any one of examples 11-19, further comprising receiving one or more properties of the device under test at a user input.

Example 21 is one or more computer readable storage media having instructions stored thereon that, when executed by a processor of a test and measurement system, cause the test and measurement system to measure a primary electric current signal of a primary winding of a device under test; measure a primary voltage signal across a magnetic core of the device under test; based on the primary electric current signal and the primary voltage signal, determine a magnetic loss of the device under test; and display the magnetic loss of the device under test. The magnetic loss may be a total magnetic loss, a hysteresis loss, or other losses.

Example 22 is one or more computer readable storage media of example 21, further including instructions to cause the test and measurement system to measure a secondary current signal of a secondary winding of the device under test, and wherein determining the magnetic loss includes determining the magnetic loss based on the secondary current signal.

Example 23 is the one or more computer readable storage media of example 22, wherein the magnetic loss is a hysteresis loss and is determined by generating a magnetic flux versus magnetic intensity primary curve for the device under based on the primary voltage signal and the primary current signal, generating a magnetic flux versus magnetic intensity secondary curve for the device under test based on the secondary current signal, and determining an area of the primary curve and the secondary curve.

Example 24 is the one or more computer readable storage media of any one of examples 21-23, further including instructions to cause the test and measurement system to determine whether the magnetic loss violates a condition and to instruct a display to display an alert when the condition is violated.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement instrument, comprising:
   a first port configured to receive a primary current signal from a primary winding of a device under test;
   a second port configured to receive a primary voltage signal measured across a magnetic core of the device under test;
   a user input configured to receive one or more properties of the device under test, the one or more properties of the device under test including at least one of a cross-sectional area of the device under test and a wire resistance of the device under test;
   one or more processors configured to determine a magnetic loss of the device under test based on the primary current signal, the primary voltage signal, and the one or more properties of the device under test; and
   a display configured to display the magnetic loss of the device under test.

2. The test and measurement instrument of claim 1, wherein the magnetic loss includes at least one of a total magnetic loss, a hysteresis loss, and other losses based on the total magnetic loss and the hysteresis loss.

3. The test and measurement instrument claim 2, wherein the other losses include an eddy current loss and/or an alternating current copper loss.

4. The test and measurement instrument of claim 1, further comprising a third port configured to receive a secondary current signal from the device under test acquired from a secondary winding of the device under test, wherein the one or more processors are further configured to determine the magnetic loss based on the primary current signal, the primary voltage signal, and the secondary current signal.

5. The test and measurement instrument of claim 4, wherein a secondary voltage of the secondary winding of the device under test is determined based on a turns ratio between a primary winding and a secondary winding of the device under test and a phase relationship between the primary winding and the secondary winding.

6. The test and measurement instrument of claim 4, wherein the magnetic loss is a hysteresis loss, and the hysteresis loss is determined by:
   determining a magnetic flux versus magnetic intensity primary curve for the device under test based on the primary voltage signal and the primary current signal,
   determining a magnetic flux versus magnetic intensity secondary curve for the device under test based on the secondary current signal, and
   determining an area of the primary curve and the secondary curve.

7. The test and measurement instrument of claim 1, wherein magnetic loss is a hysteresis loss, and the hysteresis loss is determined by generating a magnetic flux versus magnetic intensity curve for the device under test and determining the hysteresis loss based on an area of the curve.

8. The test and measurement instrument of claim 1, wherein the magnetic loss is a copper loss, the wire resistance is a copper resistance, and the one or more processors are further configured to determine the copper loss based on the primary current signal and the copper resistance.

9. The test and measurement instrument of claim 1, wherein the one or more processors are further configured to determine whether the magnetic loss violates a condition and to display an indicator on the display when the condition is violated.

10. A method for determining a magnetic loss of a device under test, comprising:
    measuring a primary current signal of a primary winding of a device under test;
    measuring a primary voltage signal across a magnetic core of the device under test;
    receiving one or more properties of the device under test at a user input, the one or more properties of the device under test including at least one of a cross-sectional area of the device under test and a wire resistance of the device under test;
    determining a magnetic loss of the device under test based on the primary current signal and the primary voltage signal; and
    displaying, on a display, the magnetic loss of the device under test.

11. The method of claim 10, wherein the magnetic loss includes at least one of a total magnetic loss, a hysteresis loss, and other losses based on the total magnetic loss and the hysteresis loss.

12. The method of claim 11, wherein the other losses include an eddy current loss and/or an alternating current copper loss.

13. The method of claim 10, further comprising measuring a secondary current signal of a secondary winding of the device under test, and wherein determining the magnetic loss includes determining the total magnetic loss and the hysteresis loss based on the secondary current signal.

14. The method of claim 13, further comprising determining a secondary voltage of the secondary winding of the device under based on a turns ratio between a primary winding and a secondary winding of the device under test and a phase relationship between the primary winding and the secondary winding.

15. The method of claim 13, wherein the magnetic loss is a hysteresis loss, and the hysteresis loss is determined by:
    determining a magnetic flux versus magnetic intensity primary curve for the device under test based on the primary voltage signal and the primary current signal,
    determining a magnetic flux versus magnetic intensity secondary curve for the device under test based on the secondary current signal, and
    determining an area of the primary curve and the secondary curve.

16. The method of claim 10, wherein the magnetic loss is a hysteresis loss, and the hysteresis loss is determined by determining a magnetic flux versus magnetic intensity curve for the device under test and determining the hysteresis loss based on an area of the curve.

17. The method of claim 10, wherein the magnetic loss is a copper loss the wire resistance is a copper resistance, and the method further comprises determining the copper loss based on the primary current signal and the copper resistance.

18. The method of claim 10, further comprising determining whether the magnetic loss violates a condition and displaying an indicator on the display when the condition is violated.

* * * * *